United States Patent
Son et al.

(10) Patent No.: US 9,465,757 B2
(45) Date of Patent: Oct. 11, 2016

(54) MEMORY DEVICE WITH RELAXED TIMING PARAMETER ACCORDING TO TEMPERATURE, OPERATING METHOD THEREOF, AND MEMORY CONTROLLER AND MEMORY SYSTEM USING THE MEMORY DEVICE

(71) Applicant: Samsung Electronics Co., Ltd., Suwon-si (KR)

(72) Inventors: Jong-pil Son, Seongnam-si (KR); Uk-song Kang, Seongnam-si (KR); Chul-woo Park, Yongin-Si (KR); Seong-young Seo, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 176 days.

(21) Appl. No.: 14/290,997

(22) Filed: May 30, 2014

(65) Prior Publication Data

US 2014/0359242 A1    Dec. 4, 2014

(30) Foreign Application Priority Data

Jun. 3, 2013   (KR) .......................... 10-2013-0063696

(51) Int. Cl.
| | |
|---|---|
| *G06F 12/02* | (2006.01) |
| *G06F 13/16* | (2006.01) |
| *G11C 11/406* | (2006.01) |

(52) U.S. Cl.
CPC ..... *G06F 13/1689* (2013.01); *G11C 11/40626* (2013.01)

(58) Field of Classification Search
CPC ... G06F 13/1689; G11C 7/1072; G11C 7/22; G11C 13/1066; G11C 13/40611; G11C 11/40626
See application file for complete search history.

(56) References Cited

U.S. PATENT DOCUMENTS

| | | | | |
|---|---|---|---|---|
| 4,716,551 | A | * 12/1987 | Inagaki ................ | G11C 11/406 327/187 |
| 6,438,057 | B1 | * 8/2002 | Ruckerbauer ........... | G11C 7/04 365/211 |
| 6,496,906 | B1 | 12/2002 | Novak et al. | |
| 6,667,925 | B2 | * 12/2003 | Kobayashi ............ | G11C 11/406 365/189.09 |
| 6,756,856 | B2 | 6/2004 | Song et al. | |
| 7,075,847 | B2 | 7/2006 | Kim et al. | |

(Continued)

FOREIGN PATENT DOCUMENTS

| | | |
|---|---|---|
| JP | 2004-500667 | 1/2004 |
| JP | 2006-260159 | 9/2006 |

(Continued)

*Primary Examiner* — Hiep Nguyen
(74) *Attorney, Agent, or Firm* — Muir Patent Law, PLLC

(57) ABSTRACT

A memory device used with a relaxed timing requirement specification according to temperatures, an operation method thereof, and a memory controller and a memory system using the memory device are provided. The memory device has a first timing characteristic at a first temperature and a second timing characteristic that is longer than the first timing characteristic at a second temperature. If a temperature of the memory device is higher than a reference temperature, the memory controller controls the first timing characteristic as a timing requirement specification of the memory device. If the temperature of the memory device is lower than the reference temperature, the memory controller controls the second timing characteristic as the timing requirement specification of the memory device.

17 Claims, 15 Drawing Sheets

(56) References Cited

U.S. PATENT DOCUMENTS

| | | | |
|---|---|---|---|
| 7,085,185 B2 * | 8/2006 | Schroder | G11C 7/04 365/203 |
| 7,120,549 B2 | 10/2006 | Lee | |
| 7,190,628 B2 | 3/2007 | Choi et al. | |
| 7,395,176 B2 | 7/2008 | Chung et al. | |
| 7,583,553 B2 | 9/2009 | Mori | |
| 7,644,248 B2 | 1/2010 | Subashchandrabose et al. | |
| 7,813,205 B2 * | 10/2010 | Sako | G11C 11/406 365/211 |
| 7,990,776 B2 | 8/2011 | Kim et al. | |
| 9,194,754 B2 * | 11/2015 | Walker | G11C 7/00 365/203 |
| 2007/0268766 A1 * | 11/2007 | Mori | G11C 7/04 365/212 |
| 2009/0327623 A1 | 12/2009 | Ochiai | |
| 2013/0166931 A1 * | 6/2013 | Castagnetti | G11C 7/22 713/322 |
| 2015/0279446 A1 * | 10/2015 | Halbert | G11C 11/4094 365/203 |

FOREIGN PATENT DOCUMENTS

| | | |
|---|---|---|
| JP | 2006-268734 | 10/2006 |
| JP | 2008-015699 | 1/2008 |
| JP | 2009-259114 | 11/2009 |
| JP | 2010-003067 | 1/2010 |
| JP | 2011-060162 | 3/2011 |
| KR | 10-1999-0079983 | 11/1999 |
| KR | 10-2002-0091657 A | 12/2002 |
| KR | 10-2005-0007910 A | 1/2005 |
| KR | 10-2005-0072840 A | 7/2005 |
| KR | 10-2005-0082579 A | 8/2005 |
| KR | 10-2006-0100776 A | 9/2006 |
| KR | 10-0610024 | 8/2008 |

\* cited by examiner

MEMORY DEVICE WITH RELAXED TIMING PARAMETER ACCORDING TO TEMPERATURE, OPERATING METHOD THEREOF, AND MEMORY CONTROLLER AND MEMORY SYSTEM USING THE MEMORY DEVICE

CROSS-REFERENCE TO RELATED APPLICATIONS

This application claims the benefit of Korean Patent Application No. 10-2013-0063696, filed on Jun. 3, 2013, in the Korean Intellectual Property Office, the disclosure of which is incorporated herein by reference in its entirety.

BACKGROUND

The disclosure relates to a semiconductor memory device, and a memory system and a memory controller that are designed to use a memory device with a relaxed timing requirement specification at a low temperature and thus to improve yield of the memory device.

A memory device operates according to timing parameters such as a time to write data to a memory cell, a wordline activation time, and a precharge time. Since the timing parameters have characteristics that times become longer at a low temperature, the timing parameters are regarded as violating a timing requirement specification of the memory device during a test, thereby reducing semiconductor yield. The reduction in the semiconductor yield is expected to be more serious with a tendency to semiconductor microfabrication. Therefore, there is a demand for a method of systematically managing timing parameters according to a temperature.

SUMMARY

The disclosure provides a memory device used with a relaxed timing requirement specification, operating method thereof, and a memory controller and a memory system using the memory device.

According to an embodiment of the disclosure, there is provided a method of operating a memory device including a plurality of memory cells, the method comprising steps of setting a first timing parameter when a temperature of the memory device is a first temperature, applying the first timing parameter when writing data to a set of memory cells of the memory device, switching the first timing parameter to a second timing parameter that includes a time period longer than the one of the first timing parameter when a temperature of the memory device is a second temperature, and applying the second timing parameter when writing data to the set of memory cells.

The first timing parameter may be a first timing requirement specification, and the second timing parameter may be a second timing requirement specification. The first and/or the second timing requirement specifications may be defined in a standard for the memory device.

The first temperature may be higher than the second temperature. The method may further include providing temperature information of the memory device to a memory controller, wherein the memory controller may control the switching of the timing parameter of the memory device based on the temperature information. The method may further include using the memory controller to set a mode register of the memory device according to the timing parameter. An auto pre-charging time period of the cells of the memory device may be changed by the setting of the mode register. The first and the second timing parameters may be write recovery timing parameters.

Another embodiment provides a memory device including a plurality of memory cells, a plurality of word lines electrically coupled to the memory cells, a plurality of bit lines electrically coupled to the memory cells, and a temperature sensor configured to detect the temperature of the memory device, wherein the memory device is configured to use a first timing requirement specification when the detected temperature is a first temperature higher than a predetermined temperature, and a second timing requirement specification when the detected temperature is a second temperature lower than the predetermined temperature.

The memory device may include a mode register configured to set an auto pre-charge time period of the memory device, wherein the memory device may start to pre-charge after a time elapse of the auto pre-charge time period after a write operation is completed. The write operation may be completed when a bit line data is sent to designated memory cells.

The first and the second timing requirement specifications may be write recovery timing requirement specifications. The memory device may include a register configured to store the temperature detected by the temperature sensor. The memory device may be a dynamic random access memory.

Another embodiment provides a memory system including a memory device including memory cells, a memory controller configured to receive temperature information from outside of the memory controller, and configured to apply a first timing parameter to control the memory device when the temperature information indicates that a temperature is higher than a predetermined temperature and to apply a second timing parameter that includes time periods longer than those of the first timing parameter to control the memory device when the temperature information indicates that a temperature is lower than the predetermined temperature.

The first timing parameter may be a first timing requirement specification and the second timing parameter may be a second timing requirement specification. The first and/or the second timing requirement specifications may be defined in a standard for the memory device.

The memory system may include a mode register configured to store an auto pre-charge time period of the memory device. The memory system may include a central processing unit configured to send write commands and read commands to the memory controller to write data to and read data from the memory device. The memory system may include a temperature sensor configured to detect a temperature, and a register configured to store the detected temperature information. The temperature sensor may be formed in a memory device, a serial presence detect chip or a buffer chip.

The memory controller may include an information receiver, an input/output unit, and an arbiter, wherein the information receiver may be configured to receive temperature information from the memory device through the input/output unit and transmit the temperature information to the arbiter and the arbiter may be configured to compare the temperature of the memory device with the predetermined temperature and choose the first timing parameter or the second timing parameter.

The memory system may include a memory module including a serial presence detect chip configured to store information of the structure of the memory module and provide the information to the memory system, the memory device and one or more additional memory devices.

The memory system may include a signal line, and a memory module comprising a buffer chip, the memory device, and one or more additional memory devices, wherein the signal line may be configured to transfer signals between the memory module and the memory controller, and the buffer chip may be configured to buffer signals received from the memory controller.

The memory system may include a temperature sensor formed in a serial presence detect chip or a buffer in a memory module.

Another embodiment provides a memory controller including an information receiver, an input/output unit, and an arbiter, wherein the information receiver may be configured to receive temperature information from a memory device or a memory module through the input/output unit and transmit the temperature information to the arbiter and the arbiter may be configured to compare the temperature of the memory device or the memory module with a predetermined temperature and choose a first timing parameter or a second timing parameter according to the comparison result. The first and the second timing parameters may be write recovery timing requirement specifications.

BRIEF DESCRIPTION OF THE DRAWINGS

Exemplary embodiments of the disclosure will be more clearly understood from the following detailed description in conjunction with the accompanying drawings in which.

DETAILED DESCRIPTION OF THE EMBODIMENTS

Figure 1A:
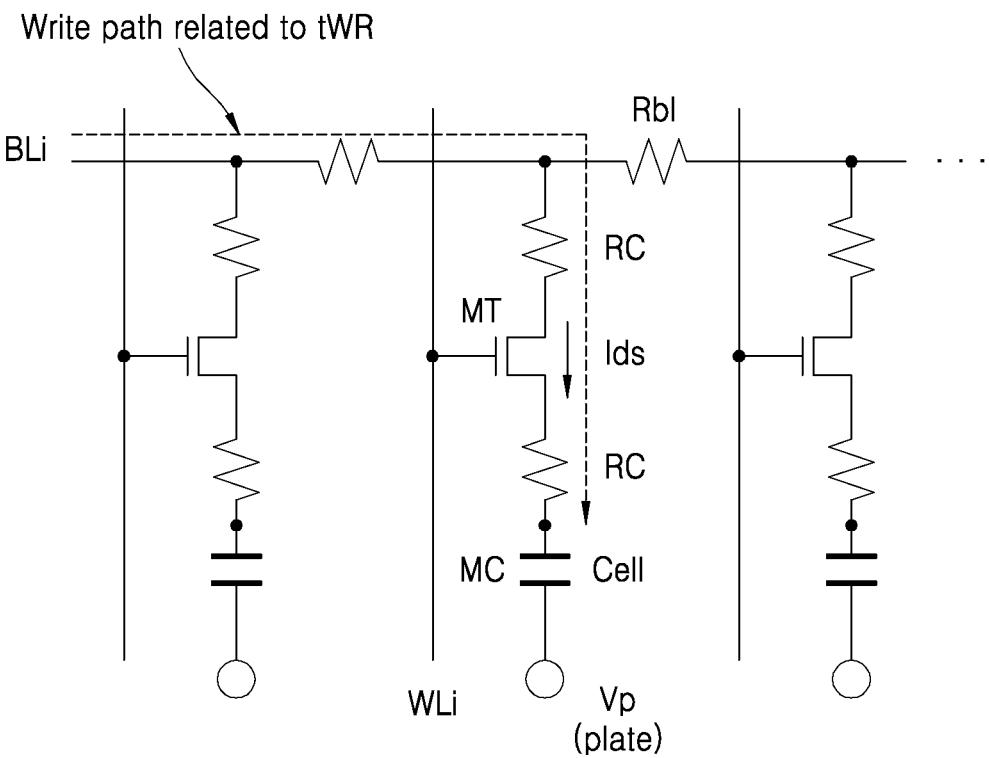
FIGS. 1A through 1C are diagrams for explaining a tWR timing parameter according to an embodiment of the disclosure.

As used herein, the term "and/or" includes any and all combinations of one or more of the associated listed items.

The attached drawings for illustrating exemplary embodiments of the inventive concept are referred to in order to gain a sufficient understanding of the inventive concept, the merits thereof, and the objectives accomplished by the implementation of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; it is to be appreciated that all changes, equivalents, and substitutes that do not depart from the spirit and technical scope of the disclosed embodiments are encompassed in the inventive concept. In the drawings, like reference numerals denote like elements, and thicknesses of layers and regions are exaggerated for clarity.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, components, and/or combinations thereof, but do not preclude the presence or addition of one or more other features, integers, steps, operations, elements, components, and/or combinations thereof.

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In a dynamic random access memory (DRAM) from among semiconductor memory devices, timing parameters include core-timing parameters such as a row cycle time tRC, a RAS-to-CAS delay time tRCD, a write recovery time tWR, a row precharge time tRP, a row active to row active delay tRRD, etc.

The row cycle time tRC indicates a time interval between an active command and the next active command, for example to the same bank. The RAS-to-CAS delay time tRCD indicates a time interval between applying an RAS signal and applying a CAS signal or a time interval between a row active command and a column active command. The write recovery time tWR indicates a time interval between enabling a word line and writing data to a memory cell. The row precharge time tRP indicates a time interval between the write recovery time tWR and the precharging of a bit line in order to prepare a next active command. The row active to row active delay tRRD indicates a time interval between successive row active commands to different banks or a row active-to-row active time between different banks.

As semiconductor fabrication is micronized, the timing parameters become longer, thereby reducing semiconductor yield. For example, increasing write recovery time tWR is a cause of reduction in semiconductor yield.

Figure 1B:
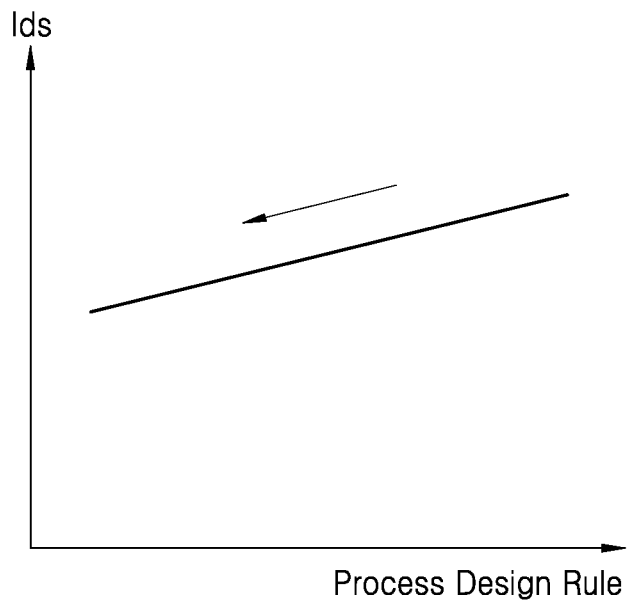
Figure 1C:
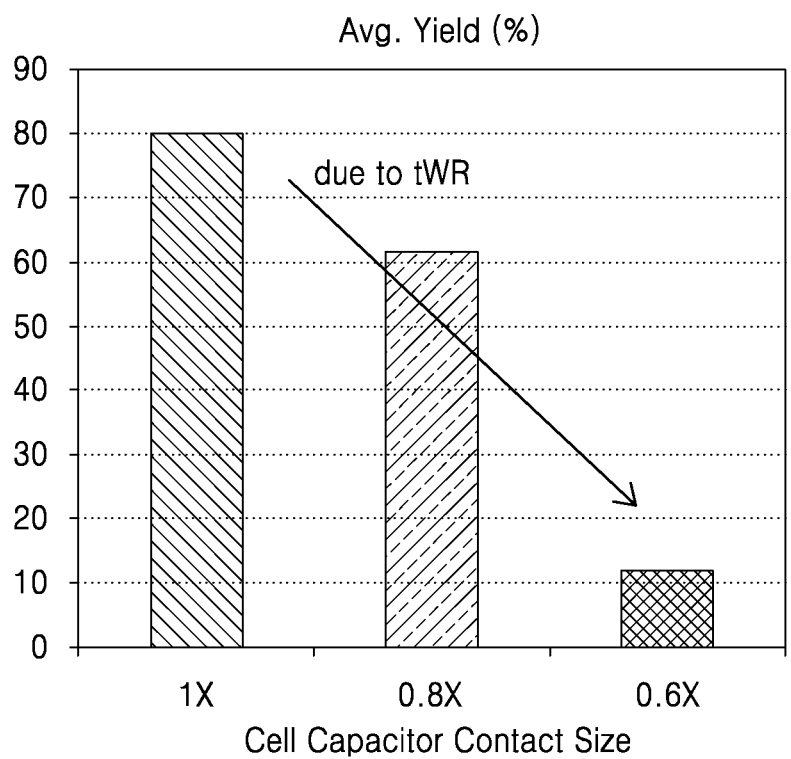

FIGS. 1A through 1C are diagrams for explaining a tWR timing parameter according to semiconductor microfabrication.

FIG. 1A shows a data write path related to the tWR timing parameter. The data write path includes a path through which data of a bitline BLi is stored in a memory cell capacitor MC through a memory cell transistor MT after a wordline WLi is enabled. As DRAM fabrication process is micronized, the contact size of the memory cell capacitor MC is reduced and thus a contact resistance Rc is increased. A bitline resistance Rbl is also increased because bitlines BLi are patterned narrowly.

Referring to FIG. 1B, current Ids of the memory cell transistor MT is reduced as the design rule is reduced. A data write time may become longer, and the tWR timing parameter may become longer due to resistance increase such as the bitline resistance Rbl and the contact resistance Rc, and current decrease of the memory cell transistor MT on the data write path. If the tWR timing is longer than a specified requirement, a DRAM may fail during testing, thereby reducing yield of the DRAM.

Referring to FIG. 1C, the yield of DRAM decreases as the contact size of the memory cell capacitor MC decreases from 1× to 0.8× and 0.6× because the tWR timing become longer.

Figure 2A:
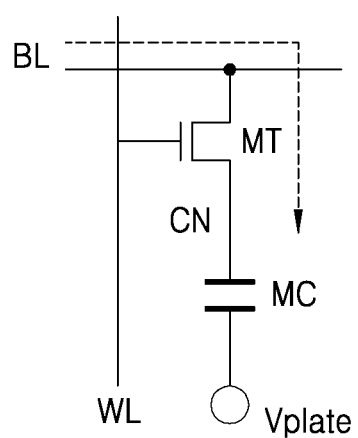
FIGS. 2A through 2C are diagrams for explaining a tWR timing margin according to an embodiment of the disclosure.
Figure 2B:
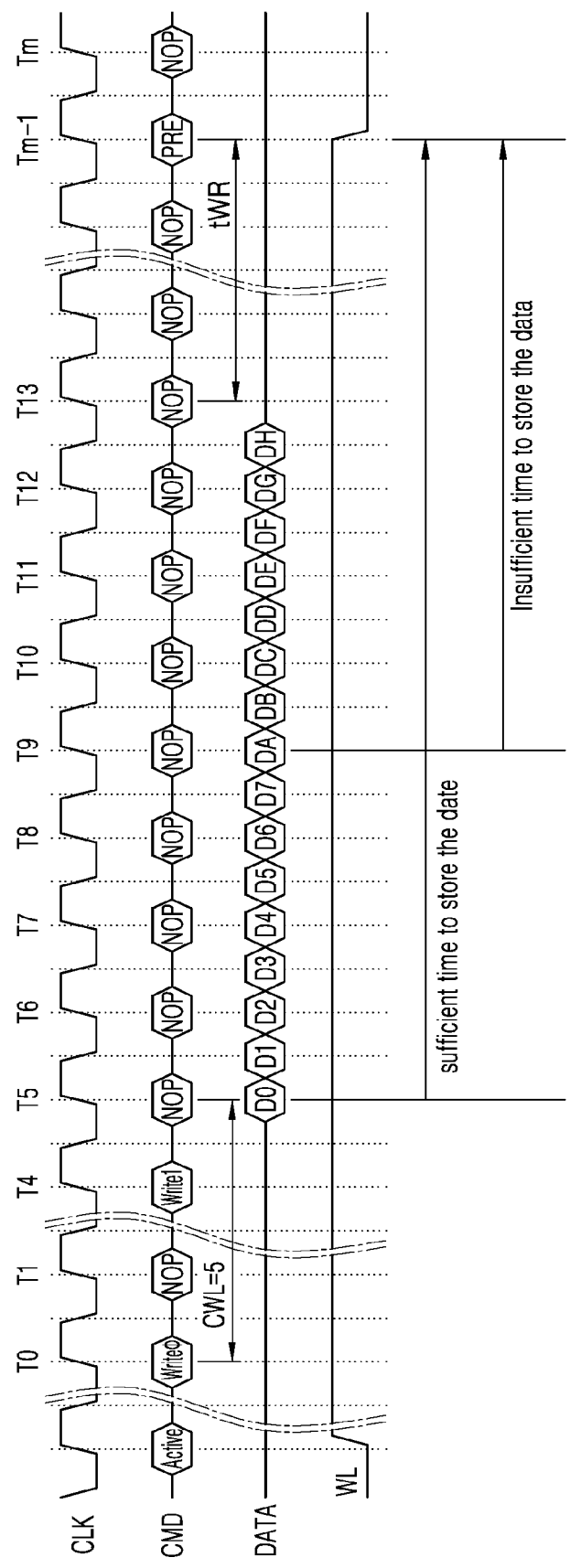
Figure 2C:
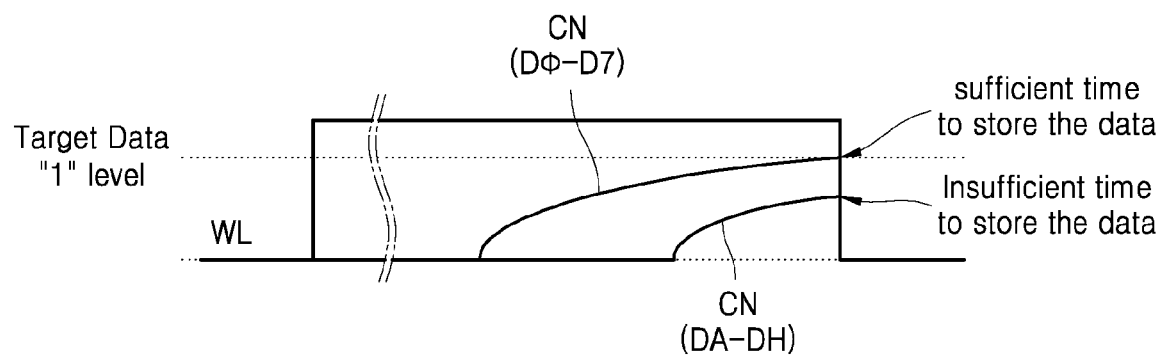

FIGS. 2A through 2C are diagrams for explaining a tWR timing margin according to a write cycle.

Referring to FIG. 2A, a DRAM cell includes a memory cell transistor MT and a memory cell capacitor MC. The memory cell transistor MT is turned on and/or off by a wordline WL. Data transmitted to a bitline BL is transmitted to a cell node CN through the memory cell transistor MT and written to the memory cell capacitor MC.

FIG. 2B is a timing diagram for explaining a burst write operation from among DRAM write operations when a clock write latency CWL is 5 and a burst length BL is 8. A DRAM may enable a wordline WL according to a row address and a bank by using an active command CMD. A first write command Write0 CMD is applied at a time T0, and first write data D0 through D7 corresponding to a first burst length (BL=8) may be input at a time T5 after clock cycles (CWL=5). A second write command Write1 CMD is applied at a time T4, and second data DA through DH corresponding to a second burst length (BL=8) may be input at a time T9 after 5 clock cycles (CWL=5).

A precharge command PRE CMD may be input at a time Tm-1. A write cycle according to the second write command Write1 CMD at a time T4 may have an insufficient data write time tWR due to a precharge operation according to the precharge command PRE CMD. The precharge operation directly disables the wordline WL. Therefore, the second write cycle that is the last write cycle may have an insufficient data write time because the wordline WL is enabled for a relatively short time.

FIG. 2C is a diagram for explaining a voltage level of the cell node CN between the memory cell transistor MT and the memory cell capacitor MC of FIG. 2A. For example, if target data "1" level is written, while the wordline WL is enabled, the target data "1" level is transmitted to the cell node CN, and thus the first write data D0 through D7 according to the first write command Write0 CMD may have a sufficient data write time tWR. By contrast, since the wordline WL is disabled before the target data "1" level is transmitted to the cell node CN, the second write data D0 through D7 according to the second write command Write1 CMD may have an insufficient data write time tWR.

The data write time tWR for the last write cycle operation performed immediately before a precharge command may be insufficient because it has less time than the other data write times, and thus a tWR timing margin may be lacking for the last write cycle. Also, a resistance component of the DRAM increases and the data write time tWR becomes longer as the temperature decreases. Therefore, the DRAM may be regarded as violating a tWR timing requirement specification defined in a DRAM standard.

Figure 3A:
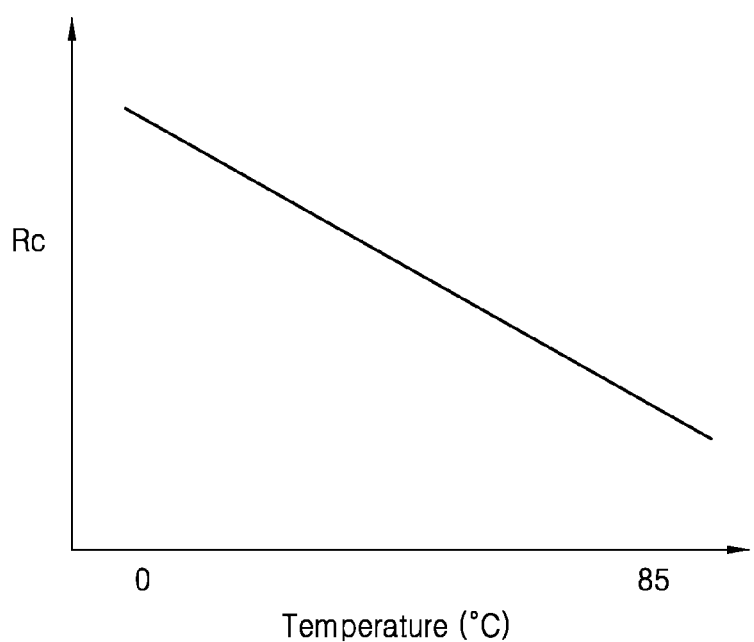
FIGS. 3A through 3C are graphs for explaining a tWR timing failure according to temperature.
Figure 3B:
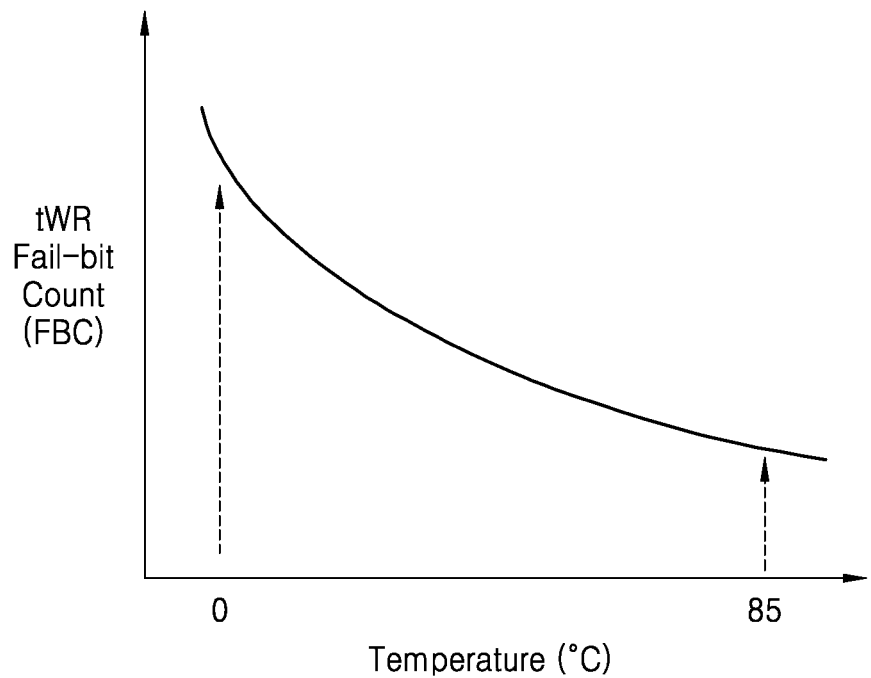
Figure 3C:
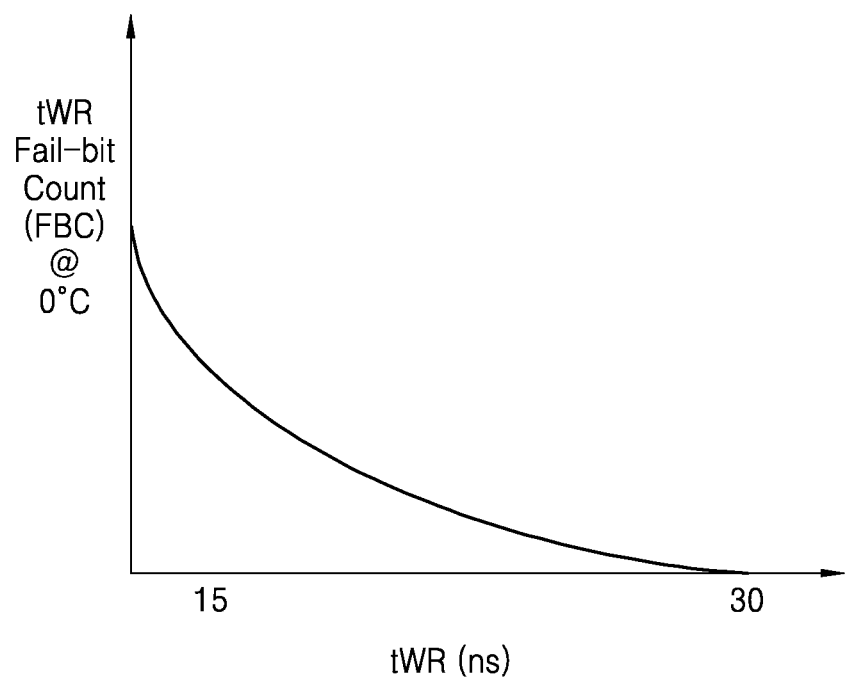

FIGS. 3A through 3C are graphs for explaining a tWR timing failure according to temperature.

Referring to FIG. 3A, as a temperature drops from 85° C. to 0° C., i.e., as the temperature is lowered, resistance values of the contact resistance Rc of FIG. 1A increase. The data write time tWR may be expected to be longer with the increases in the resistance values of the contact resistance Rc. It is assumed that a tWR timing requirement specification is 15 ns. Referring to FIG. 3B, a tWR timing fail bit count (FBC) when the temperature is 0° C. is higher than a tWR timing FBC when the temperature is 85° C.

If the tWR timing requirement specification is set to be longer than 15 ns when the temperature is 0° C., the tWR timing FBC may be reduced. Referring to FIG. 3C, if the tWR timing requirement specification is increased from 15 ns to about 30 ns, the tWR timing FBC is greatly reduced when the temperature is 0° C. This means that fail bits with 15 ns tWR may be pass bits with 30 ns tWR timing requirement specification. Therefore, DRAMs that are to be treated as tWR timing failures may be treated as being in high quality, thereby increasing yield of the DRAMs.

Figure 4:
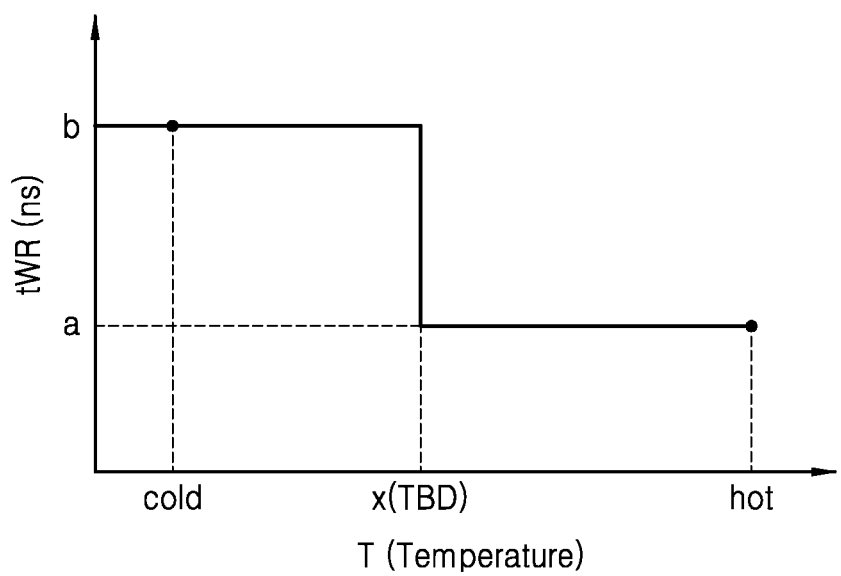
FIG. 4 is a graph for explaining a tWR timing requirement specification of a dynamic random access memory (DRAM) according to an exemplary embodiment of the disclosure.

FIG. 4 is a graph for explaining a tWR timing requirement specification of a DRAM according to an exemplary embodiment of the inventive concept.

Referring to FIG. 4, the tWR timing requirement specification of the DRAM varies according to temperature. A first tWR timing requirement specification "a" is used at a temperature higher than a reference temperature TBD, and a second tWR timing requirement specification "b" that is more relaxed than the first tWR timing requirement specification "a" is used at a temperature lower than the reference temperature TBD. In one embodiment, the first tWR timing requirement specification "a" indicates a tWR timing parameter (e.g., first timing parameter) that is defined in a standard of a data sheet or a data book of the DRAM (e.g., an industry standard). In this embodiment, the second tWR timing requirement specification "b" may indicate a tWR timing parameter (e.g., second timing parameter) that violates a timing requirement specification defined in the standard of the DRAM.

In one embodiment, the reference temperature TBD may be set according to a definition of a user. The reference temperature TBD may be set to be, for example, a normal temperature of about x° C. For example, x° C. may be about 25° C. The reference temperature x° C. may be changed according to the definition of the user and may be set between a minimum and maximum value (e.g., 0° C. and 85° C.). If a current temperature T is higher than x° C., the first tWR timing requirement specification "a" (e.g., about 15 ns) may be used as the tWR timing requirement specification. If the current temperature T is lower than x° C., the second tWR timing requirement specification "b" (e.g., about 30 ns) may be used as the tWR timing requirement specification. An exemplary tWR timing requirement specification may be expressed as in Table 1 below.

TABLE 1

|  | T < x (TBD) | T > x (TBD) |
| --- | --- | --- |
| tWR Spec. | b (ex. 30 ns) | a (ex. 15 ns) |

Figure 5A:
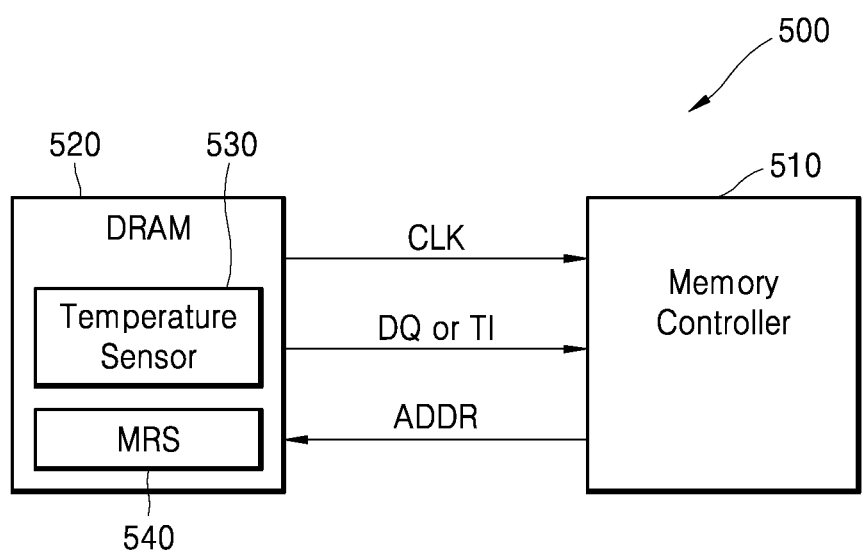
FIGS. 5A through 5C are diagrams illustrating a memory system using the tWR timing requirement specification of FIG. 4 according to an exemplary embodiment of the disclosure.
Figure 5B:
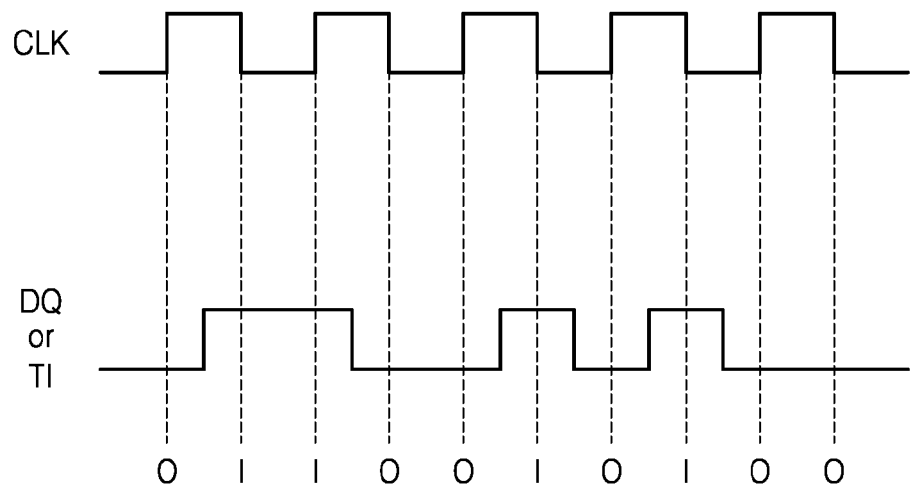
Figure 5C:
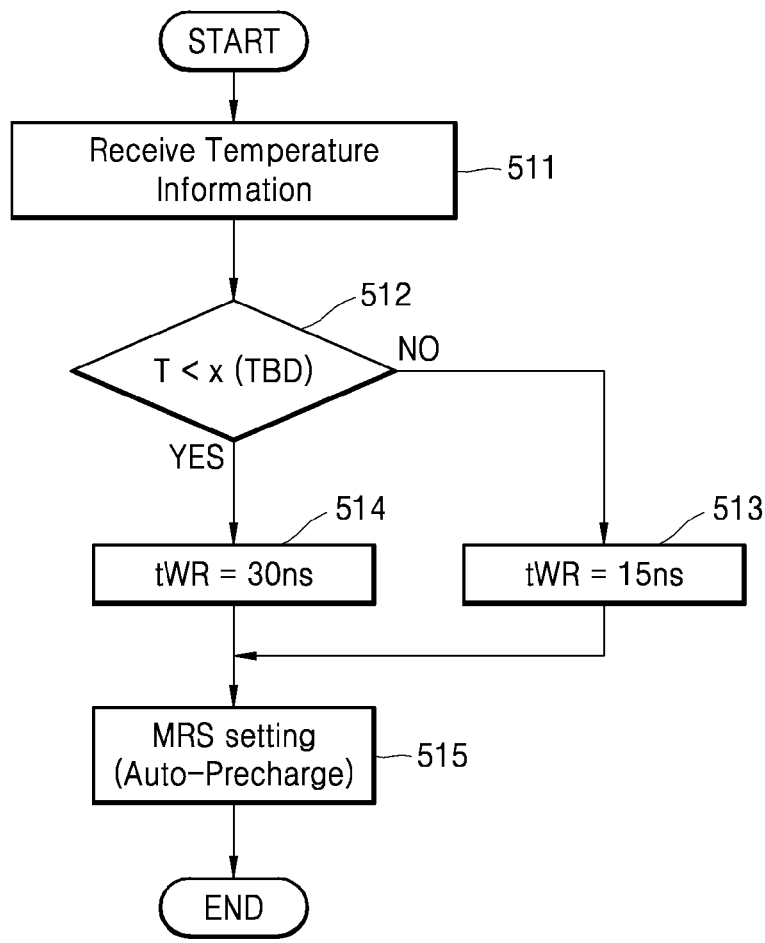

FIGS. 5A through 5C are diagrams illustrating a memory system 500 using the tWR timing requirement specification of FIG. 4 according to an exemplary embodiment of the inventive concept.

Referring to FIG. 5A, the memory system 500 includes a memory controller 510 and a memory device. The memory device may be a DRAM (or a synchronous DRAM (SDRAM)) chip. For convenience of description, it is assumed that the memory device is a memory chip 520. However, the term "memory device" may also refer to other devices, such as a stack of chips, a semiconductor package including one or more chips, or a plurality of stacked packages. As shown in FIG. 5A, the memory chip 520 includes a temperature sensor 530 that provides temperature information of the memory chip 520. The temperature sensor 530 detects a temperature of the memory chip 520 and provides temperature information about the temperature to the memory controller 510.

The memory controller 510 receives the temperature information from the temperature sensor 530 of the memory chip 520. The memory controller 510 determines whether the temperature is higher or lower than the reference temperature TBD. If it is determined that the temperature is higher than the reference temperature TBD, the memory controller 510 uses the first tWR timing requirement specification "a" (e.g., 15 ns of Table 1) as a tWR timing requirement specification of the memory chip 520. If it is determined that the temperature is lower than the reference temperature TBD, the memory controller 510 uses the second tWR timing requirement specification "b" (e.g., 30 ns) that is more relaxed than the first tWR timing requirement specification "a" as the tWR timing requirement specification of the memory chip 520.

A plurality of signal lines may be connected between the memory controller 510 and the memory chip 520, and the memory controller 510 and the memory chip 520 communicate with each other through the signal lines. For example, a plurality of signal lines may be connected to transmit and receive a command, an address signal ADDR, a clock signal CLK, data input/output signals DQs, etc.

If the first tWR timing requirement specification of 15 ns or the second tWR timing requirement specification of 30 ns is used as the tWR timing requirement specification of the memory chip 520, the memory controller 510 may change a setting of a mode register (MRS) 540 that designates an auto-precharge time period of the memory chip 520. The auto-precharge time period is a time taken to start a precharge operation after a write operation is completed. In one embodiment, the auto-precharge time period may be designated by the memory controller 510 so that an undesired delay does not occur.

The memory controller 510 may change an auto-precharge characteristic of the MRS 540 through a signal line through which the address signal ADDR is transmitted/received. In one embodiment, if the first tWR timing requirement specification of 15 ns is used as the tWR timing requirement specification of the memory chip 520, the memory controller 510 sets the auto-precharge characteristic of the memory chip 520 to 15 ns. Alternatively, if the second tWR timing requirement specification of 30 ns is used as the tWR timing requirement specification of the memory chip 520, the memory controller 510 sets the auto-precharge characteristic of the memory chip 520 to 30 ns.

The temperature information provided from the temperature sensor 530 of the memory chip 520 may be provided to the memory controller 510 through one of the plurality of signal lines. The memory chip 520 may output the temperature information of the temperature sensor 530 to one DQ pad. The memory controller 510 may receive the temperature information of the temperature sensor 530 through a signal line connected to the DQ pad of the memory chip 520.

As another method, the memory chip 520 may include an additional pad that outputs the temperature information of the temperature sensor 530. The memory chip 520 may include, for example, a temperature information (TI) pad, and provide the temperature information of the temperature sensor 530 to the memory controller 510 through a signal line connected to the TI pad. The memory controller 510 may receive the temperature information of the temperature sensor 530 through the signal line connected to the TI pad of the memory chip 520.

If the temperature information of the temperature sensor 530 is output to the one DQ pad or the TI pad, the temperature information may be expressed as 1 bit. If the temperature indicated by the temperature information of the temperature sensor 530 is higher than the reference temperature TBD, the one DQ pad or the TI pad outputs logic level "1". If the temperature indicated by the temperature information of the temperature sensor 530 is lower than the reference temperature TBD, the one DQ pad or the TI pad outputs logic level "0". The one DQ pad or the TI pad may output an opposite logic level of the above.

In one embodiment, the temperature information output to the one DQ pad or the TI pad may be, for example, serial bit information as shown in FIG. 5B. The memory chip 520 may output the serial bit information, for example, "0110010100", to the DQ pad or the TI pad according to an edge of the clock signal CLK. The serial bit information output to the DQ pad or the TI pad may be provided to the memory controller 510, and the memory controller 510 may receive and decode the serial bit information to determine whether the temperature of the temperature information of the serial bit information is higher or lower than the reference temperature TBD.

FIG. 5C is a flowchart illustrating a method performed by the memory controller 510 to change the tWR timing requirement specification of the memory chip 520.

Referring to FIG. 5C, in operation 511, the memory controller 510 receives temperature information T about a temperature from the memory chip 520. In operation 512, the memory controller 510 determines whether the temperature corresponding to the received temperature information T is higher or lower than a reference temperature TBD. If it is determined in operation 512 that the temperature corresponding to the temperature information T is higher than the reference temperature TBD, the memory controller 510 uses the first tWR timing requirement specification of 15 ns as the tWR timing requirement specification of the memory chip 520 in operation 513. If it is determined in operation 512 that the temperature corresponding to the received temperature information T is lower than the reference temperature TBD, the memory controller 510 uses the second tWR timing requirement specification of 30 ns that is more relaxed than the first tWR timing requirement specification of 15 ns as the tWR timing requirement specification of the memory chip 520, in operation 514.

If the first tWR timing requirement specification of 15 ns or the second tWR timing requirement specification of 30 ns is used as the tWR timing requirement specification of the memory chip 520 in operations 513 and 514, the memory controller 510 may change the setting of the MRS that designates an auto-precharge time period of the memory chip 520 in operation 515. If the first tWR timing requirement specification of 15 ns is used as the tWR timing requirement specification of the memory chip 520, the memory controller 510 may set an auto-precharge characteristic of the memory chip 520 to 15 ns. If the second tWR timing requirement specification of 30 ns is used as the tWR timing requirement specification of the memory chip 520, the memory controller 510 may set the auto-precharge characteristic of the memory chip 520 to 30 ns. In one embodiment, as soon as the memory chip 520 completes a write operation according to the corresponding tWR timing requirement specification, the memory chip 520 automatically starts a pre-charge operation. Therefore, there may not be a timing confusion between the memory controller 510 and the memory chip 520.

Figure 6:
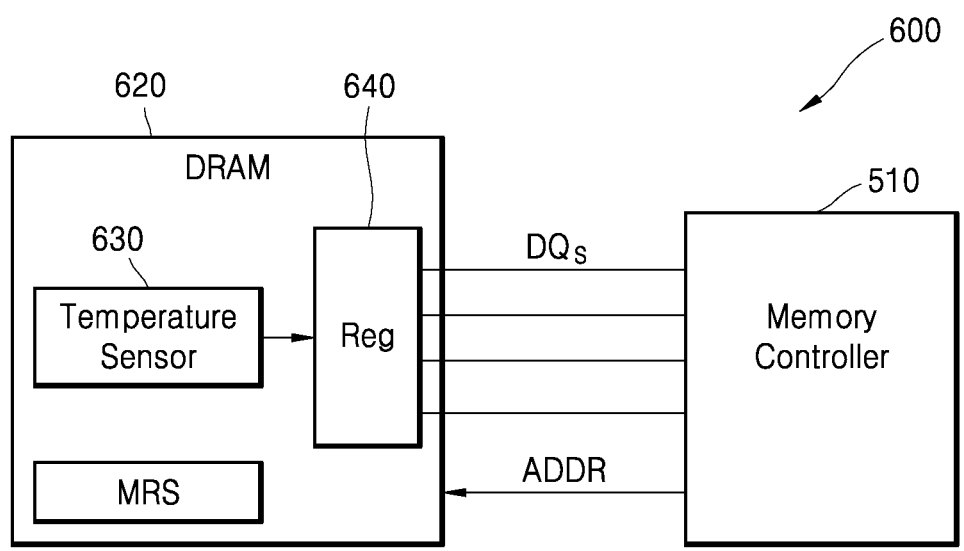
FIG. 6 is a block diagram illustrating a memory system using the tWR timing requirement specification of FIG. 4 according to another exemplary embodiment of the disclosure.

FIG. 6 is a block diagram illustrating a memory system 600 using the tWR timing requirement specification of FIG. 4 according to another exemplary embodiment of the inventive concept.

Referring to FIG. 6, the memory system 600 includes a memory controller 510 and a memory chip 620. The memory system 600 is different from the memory system 500 of FIG. 5A in that temperature information of the memory chip 620 is provided as parallel bit information to the memory controller 510 through a plurality of DQ lines.

Like the memory controller 510 of FIG. 5A, the memory controller 510 receives the temperature information about a temperature of the memory chip 620 and determines whether the temperature of the received temperature information is higher or lower than a reference temperature TBD. If it is determined that the temperature of the temperature information is higher than the reference temperature TBD, the memory controller 510 uses a first tWR timing requirement specification "a" of 15 ns as a tWR timing requirement specification of the memory chip 620. If it is determined that the temperature of the temperature information is lower than the reference temperature TBD, the memory controller 510 uses a second tWR timing requirement specification "b" of 30 ns that is more relaxed than the first tWR timing requirement specification "a" as the tWR timing requirement specification of the memory chip 620.

If the memory controller 510 uses the first tWR timing requirement specification of 15 ns or the second tWR timing requirement specification of 30 ns as the tWR timing requirement specification of the memory chip 620, the memory controller 510 may change a setting of an MRS that designates an auto-precharge time period of the memory chip 620. If the first tWR timing requirement specification of 15 ns is used as the tWR timing requirement specification of the memory chip 620, the memory controller 510 may set an auto-precharge characteristic of the memory chip 620 to 15 ns. If the second tWR timing requirement specification of 30 ns is used as the tWR timing requirement specification of the memory chip 620, the memory controller 510 may set the auto-precharge characteristic of the memory chip 620 to 30 ns. As soon as a write operation is completed according to the corresponding tWR timing requirement specification, the memory chip 620 may automatically start a precharge operation.

The memory chip 620 includes a temperature sensor 630 that detects a temperature of the memory chip 620 and a register 640 that stores the detected temperature as parallel bit information. The register 640 may be a multipurpose register (MPR) that stores and reads the detected temperature as preset parallel bit information. Temperature information of the parallel bit information is provided to the memory controller 510 through DQ lines DQs.

Figure 7A:
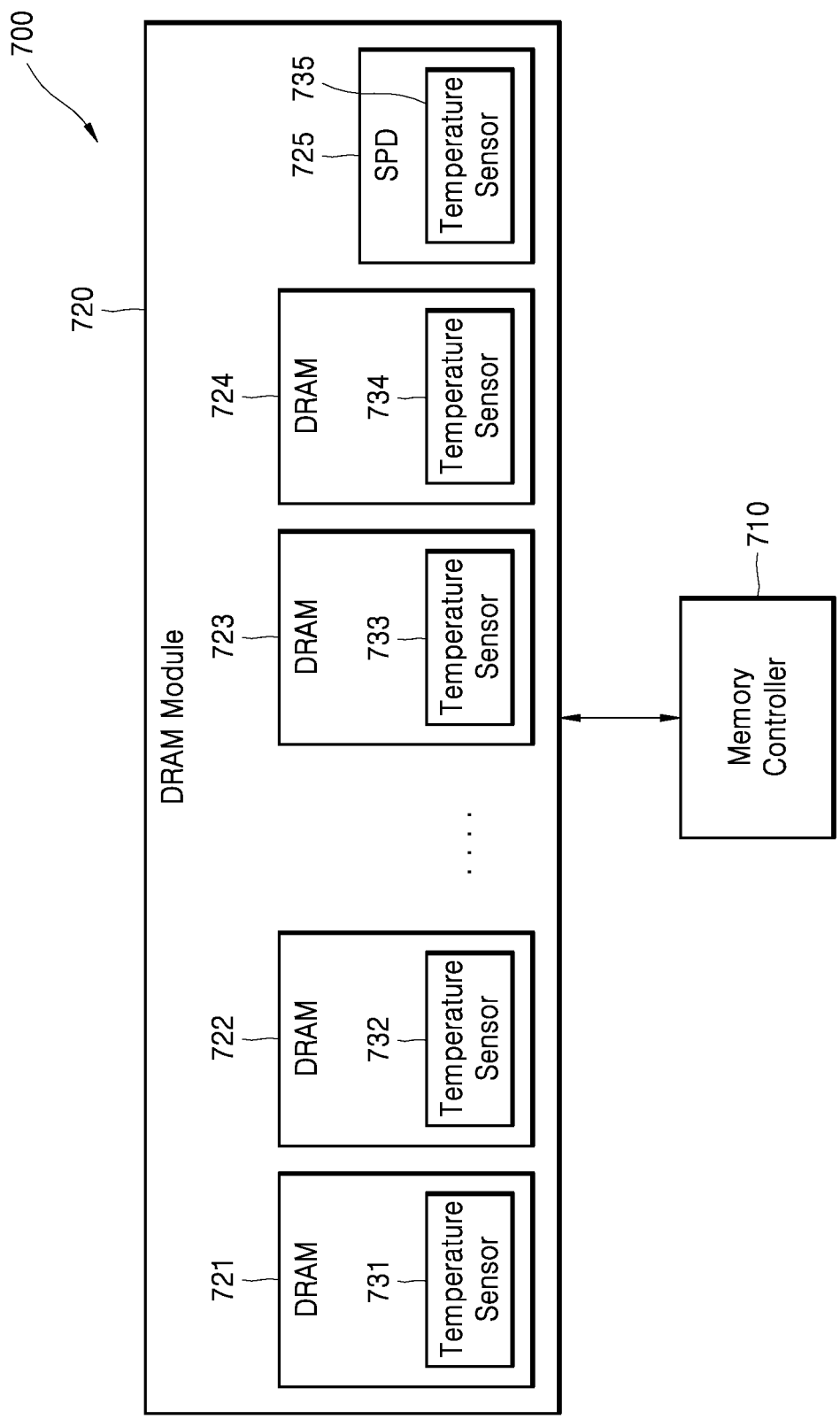
FIGS. 7A and 7B are respectively a block diagram and a flowchart illustrating a memory system using the tWR timing requirement specification of FIG. 4 according to another exemplary embodiment of the disclosure.
Figure 7B:
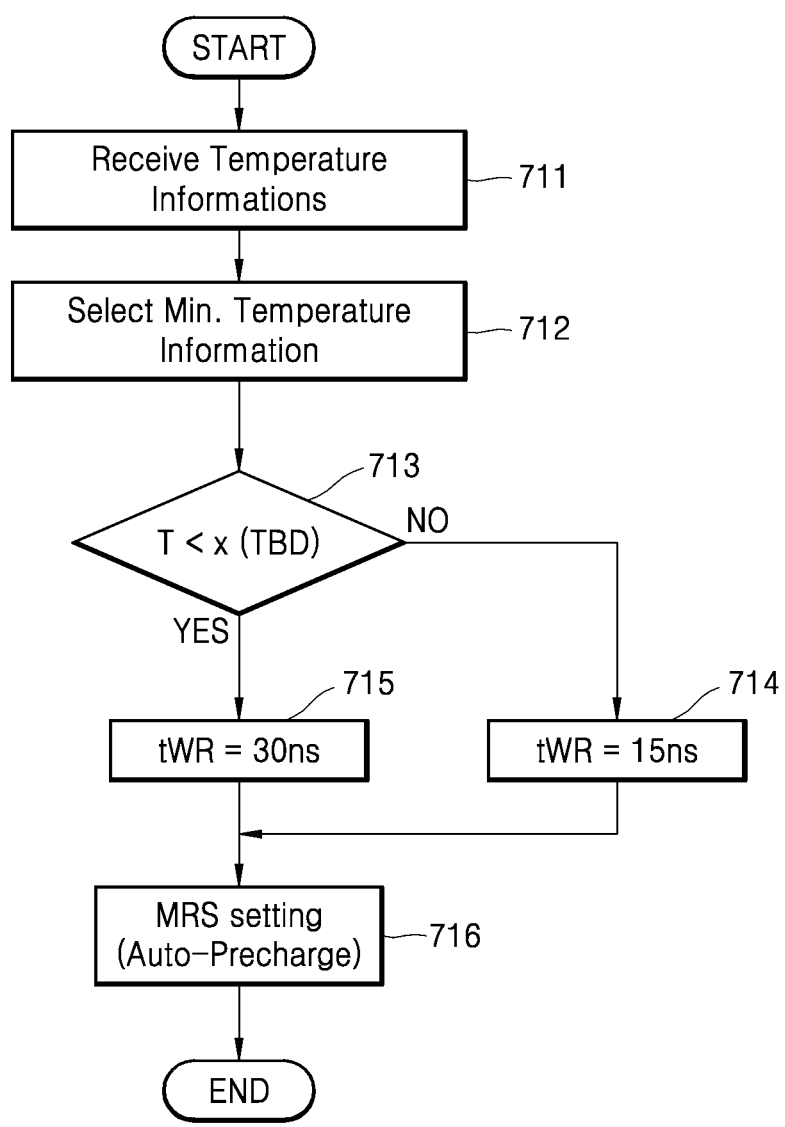

FIGS. 7A and 7B are respectively a block diagram and a flowchart illustrating a memory system 700 using the tWR timing requirement specification of FIG. 4 according to another exemplary embodiment of the inventive concept.

Referring to FIG. 7A, the memory system 700 includes a memory controller 710 and a memory module 720. The memory module 720 includes a plurality of memory chips 721 through 724 and a serial presence detect (SPD) chip 725. The memory chips 721 through 724 may be, for example, SDRAM chips. The memory chips 721 through 724 respectively include temperature sensors 731 through 734 that provide temperature information about temperatures of the memory chips 721 through 724. The temperature sensors 731 through 734 detect temperatures of the memory chips 721 through 724 and provides the temperatures to the memory controller 710.

The SPD chip 725 stores information for recognizing a structure of the memory module 720 to appropriately perform an operation of the memory module 720. The SPD chip 725 provides a memory hardware characteristic so that the memory system 700 knows about what type of memory is installed in the memory module 720 and which timing is used to access the memory.

The SPD chip 725 may store SPD information including various timing parameters related to the memory module 720, a manufacturer, a serial number, and other useful information. The SPD chip 725 may be an electrically erasable and programmable read only memory (EEPROM) that stores SPD information. Mother board basic input output systems (BIOSs) of the memory system 700 read the SPD information to configure the memory controller 710.

The SPD chip 725 includes a temperature sensor 735 that provides temperature information about a temperature of the SPD chip 725. The temperature sensor 735 detects a temperature of the SPD chip 725 and provides the temperature to the memory controller 710.

The memory module 720 may be a memory module such as a single in-line memory module (SIMM), a dual in-line memory module (DIMM), a small-outline DIMM (SO-DIMM), an unbuffered DIMM (UDIMM), a fully-buffered DIMM (FBDIMM), a rank-buffered DIMM (RBDIMM), a load-reduced DIMM (LRDIMM), a mini-DIMM, a micro-DIMM, or the like.

The memory controller 710 receives various pieces of temperature information from the temperature sensors 731 through 735 of the memory chips 721 through 724 and the SPD chip 725. The memory controller 710 receives pieces of temperature information of the memory chips 721 through 724 and the SPD chip 725, selects a lowest one from temperatures of the received pieces of temperature information, and determines whether the temperature of the selected temperature information is higher or lower than a reference temperature TBD. If it is determined that the temperature of the selected temperature information is higher than the reference temperature TBD, the memory controller 710 uses the first tWR timing requirement specifications "a" of 15 ns as tWR timing requirement specifications of the memory chips 721 through 724. If it is determined that the temperature of the selected temperature information is lower than the reference temperature TBD, the memory controller 710 uses the second tWR timing requirement specifications "b" of 30 ns that are more relaxed than the first tWR timing requirement specifications "a" as the tWR timing requirement specifications of the memory chips 721 through 724.

If the first tWR timing requirement specifications of 15 ns or the second tWR timing requirement specifications of 30 ns are used as the tWR timing requirement specifications of the memory chips 721 through 724, the memory controller 710 may change a setting of an MRS that designates auto-precharge time periods of the memory chips 721 through 724. If the first tWR timing requirement specifications of 15 ns are used as the tWR timing requirement specifications of the memory chips 721 through 724, the memory controller 710 may set auto-precharge characteristics of the memory chips 721 through 724 to 15 ns. If the second tWR timing requirement specifications of 30 ns are used as the tWR timing requirement specifications of the memory chips 721 through 724, the memory controller 710 may set the auto-precharge characteristics of the memory chips 721 through 724 to 30 ns.

FIG. 7B is a flowchart illustrating a method performed by the memory controller 710 to change tWR timing requirement specifications of the memory chips 721 through 724.

Referring to FIG. 7B, in operation 711, the memory controller 710 receives temperature information about temperatures from the memory chips 721 through 724 and the SPD chip 725. In operation 712, the memory controller 710 selects a lowest one of the temperatures of the received temperature information. If it is determined in operation 713 that the temperature of the selected temperature information T is higher than a reference temperature TBD, the memory controller 710 uses first tWR timing requirement specifications of 15 ns as tWR timing requirement specifications of the memory chips 721 through 724 in operation 714. If it is determined in operation 713 that the temperature of the selected temperature information T is lower than the reference temperature TBD, the memory controller 710 uses second tWR timing requirement specifications of 30 ns that are more relaxed than the first tWR timing requirement specifications of 15 ns as the tWR timing requirement specifications of the memory chips 721 through 724, in operation 715.

If the first tWR timing requirement specifications of 15 ns or the second tWR timing requirement specifications of 30 ns are used as the tWR timing requirement specifications in operations 714 and 715, the memory controller 710 changes a setting of an MRS that designates auto-precharge time periods of the memory chips 721 through 724 in operation 716. If the first tWR timing requirement specifications of 15 ns are used as the tWR timing requirement specifications of the memory chips 721 through 724, the memory controller 710 may set auto-precharge characteristics of the memory chips 721 through 724 to 15 ns. If the second tWR timing requirement specifications of 30 ns are used as the tWR timing requirement specifications of the memory chips 721 through 724, the memory controller 710 may set the auto-precharge characteristics of the memory chips 721 through 724 to 30 ns. As soon as a write operation is completed according to the corresponding tWR timing requirement specifications, the memory chips 721 through 724 may automatically start precharge operations.

Figure 8:
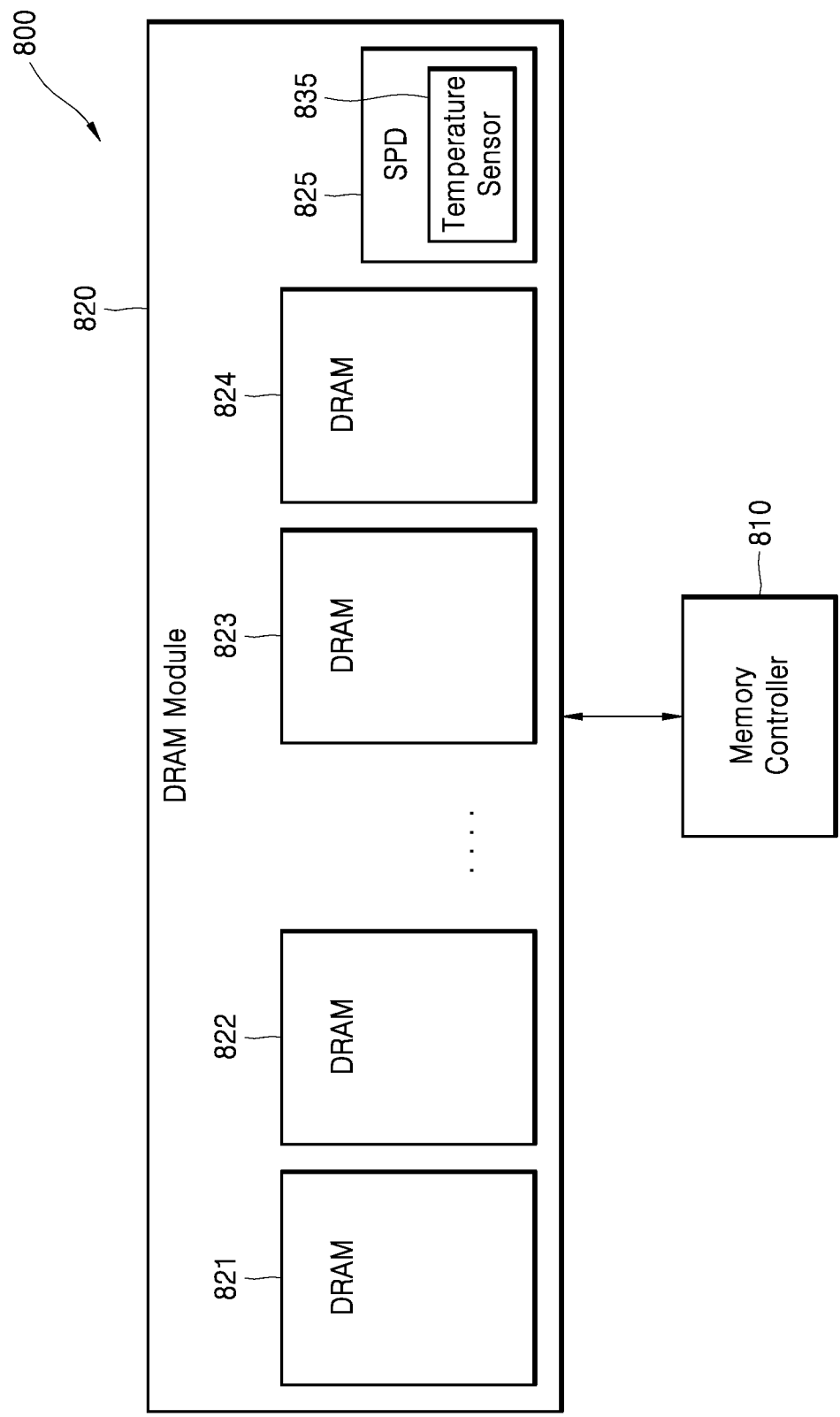
FIG. 8 is a block diagram illustrating a memory system using the tWR timing requirement specification of FIG. 4 according to another exemplary embodiment of the disclosure.

FIG. 8 is a block diagram illustrating a memory system 800 using the tWR timing requirement specification of FIG. 4 according to another exemplary embodiment of the inventive concept.

Referring to FIG. 8, the memory system 800 includes a memory controller 810 and a memory module 820. The memory system 800 is different from the memory system 700 of FIG. 7A in that memory chips 821 through 824 mounted in the memory module 820 do not have temperature sensors.

The memory module 820 includes a plurality of memory chips 821 through 824 and an SPD chip 825. The memory module 820 may be a memory module such as an SIMM, a DIMM, an SO-DIMM, a UDIMM, an FBDIMM, an RBDIMM, an LRDIMM, a mini-DIMM, a micro-DIMM, or the like. The memory chips 821 through 824 may be, for example, SDRAM chips.

The SPD chip 825 stores information for recognizing a structure of the memory module 820 to appropriately perform an operation of the memory module 820. The SPD chip 825 provides a memory hardware characteristic so that the memory system 800 knows about what type of memory is installed in the memory module 820 and which timing is used to access a memory. The SPD chip 825 may store SPD information including various timing parameters related to the memory module 820, a manufacturer, a serial number, and other useful information. The SPD chip 825 may be an EEPROM that stores SPD information. Mother board BIOSs of the memory system 800 read the SPD information to configure the memory controller 810.

The SPD chip 825 includes a temperature sensor 835 that provides temperature information about a temperature of the SPD chip 825. The temperature sensor 835 detects a temperature of the SPD chip 825 and provides the temperature to the memory controller 810.

The memory controller 810 receives the temperature information from the temperature sensor 835 of the SPD chip 825. The memory controller 810 receives the temperature information of the SPD chip 825 and determines whether the temperature of the received temperature information is higher or lower than a reference temperature TBD. If it is determined that the temperature of the received temperature information is higher than the reference temperature TBD, the memory controller 810 uses the first tWR timing requirement specifications "a" of 15 ns as tWR timing requirement specifications of the memory chips 821 through 824. If it is determined that the temperature of the received temperature information is lower than the reference temperature TBD, the memory controller 810 uses second tWR timing requirement specifications "b" of 30 ns that are more relaxed than the first tWR timing requirement specifications "a" as the tWR timing requirement specifications of the memory chips 821 through 824.

If the first tWR timing requirement specifications of 15 ns or the second tWR timing requirement specifications of 30 ns are used as the tWR timing requirement specifications of the memory chips 821 through 824, the memory controller 810 may change a setting of an MRS that designate auto-precharge time periods of the memory chips 821 through 824. If the first tWR timing requirement specifications of 15 ns are used as the tWR timing requirement specifications of the memory chips 821 through 824, the memory controller 810 may set auto-precharge characteristics of the memory chips 821 through 824 to 15 ns. If the second tWR timing requirement specifications of 30 ns are used as the tWR timing requirement specifications of the memory chips 821 through 824, the memory controller 810 may set the auto-precharge characteristics of the memory chips 821 through 824 to 30 ns. As soon as a write operation is completed according to the corresponding tWR timing requirement specifications, the memory chips 821 through 824 may automatically start precharge operations.

Figure 9:
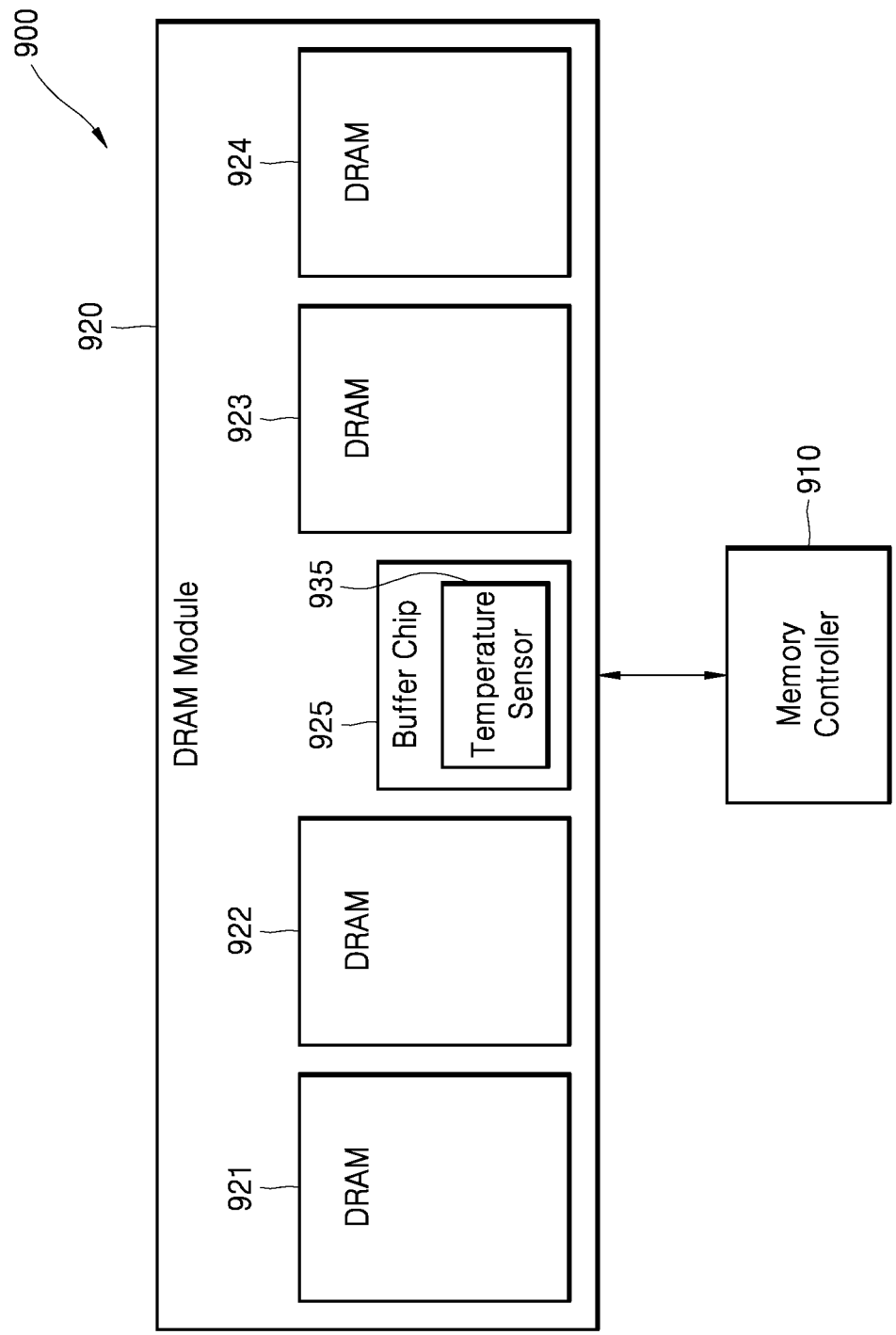
FIG. 9 is a block diagram illustrating a memory system using the tWR timing requirement specification of FIG. 4 according to another exemplary embodiment of the disclosure.

FIG. 9 is a block diagram illustrating a memory system 900 using the tWR timing requirement specification of FIG. 4 according to another exemplary embodiment of the inventive concept.

Referring to FIG. 9, the memory system 900 includes a memory controller 910 and a memory module 920. The memory module 920 includes a plurality of memory chips 921 through 924 and a buffer chip 925. The memory module 920 may be a memory module such as an SIMM, a DIMM, an SO-DIMM, a UDIMM, an FBDIMM, an RBDIMM, an LRDIMM, a mini-DIMM, or a micro-DIMM. The memory chips 921 through 924 may be, for example, SDRAM chips.

The buffer chip 925 is mounted in the memory module 920 to improve signal transmission reliability of signal lines in the memory module 920. The signal lines in the memory module 920 may include a command line, an address line, a clock line, a data line, etc. An external command such as a command, an address signal, or a clock signal received from the memory controller 910 may be buffered by the buffer chip 925 and may be provided to a common signal line of the memory chips 921 through 924, to individual signal lines of the memory chips 921 through 924, or to signal lines of some of the memory chips 921 through 924. Data may be directly transmitted from the memory controller 910 to the memory chips 921 through 924 without passing through the buffer chip 925.

The buffer chip 925 may be disposed in a center of a module board to optimize in terms of lengths, capacitances, and resistances of signal lines for the memory chips 921 through 924. The buffer chip 925 may store test results of the characteristics of the memory chips 921 through 924. The buffer chip 925 may manage operations of the memory chips 921 through 924 by using information about the stored characteristics.

The buffer chip 925 includes a temperature sensor 935 that provides temperature information about a temperature of the buffer chip 925. The temperature sensor 935 detects a temperature of the buffer chip 925 and provides the temperature to the memory controller 910.

The memory controller 910 receives the temperature information from the temperature sensor 935 of the buffer chip 925. The memory controller 910 receives the temperature information of the buffer chip 925 and determines whether the temperature of the received temperature information is higher than or lower than a reference temperature TBD. If it is determined that the temperature of the received temperature information is higher than the reference temperature TBD, the memory controller 910 uses first tWR timing requirement specifications "a" of 15 ns as tWR timing requirement specifications of the memory chips 921 through 924. If it is determined that the temperature of the received temperature information is lower than the reference temperature TBD, the memory controller 910 uses second tWR timing requirement specifications "b" of 30 ns that are more relaxed than the first tWR timing requirement specifications "a" as the tWR temperature requirement specifications of the memory chips 921 through 924.

If the first tWR timing requirement specifications of 15 ns or the second tWR timing requirement specifications of 30 ns are used as the tWR temperature requirement specifications of the memory chips 921 through 924, the memory controller 910 may change a setting of an MRS that designates auto-precharge time periods of the memory chips 921 through 924. If the first tWR timing requirement specifications of 15 ns are used as the tWR temperature requirement specifications of the memory chips 921 through 924, the memory controller 910 may set auto-precharge characteristics of the memory chips 921 through 924 to 15 ns. If the second tWR timing requirement specifications of 30 ns are used as the tWR temperature requirement specifications of the memory chips 921 through 924, the memory controller 910 may set the auto-precharge characteristics of the memory chips 921 through 924 to 30 ns. As soon as a write operation is completed according to the corresponding tWR timing requirement specifications, the memory chips 921 through 924 may automatically start precharge operations.

Figure 10A:
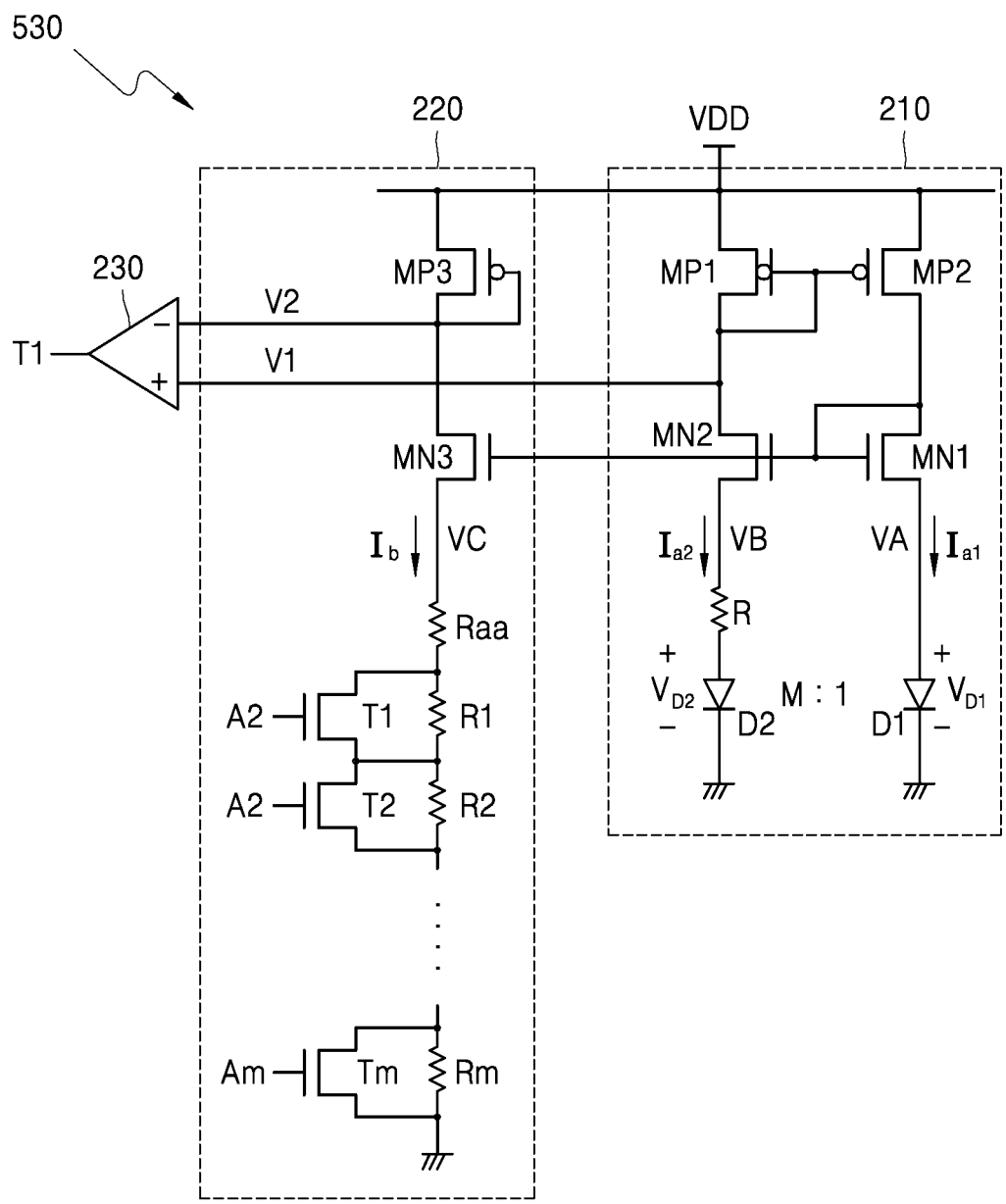
FIGS. 10A and 10B are diagrams illustrating a temperature sensor and its operation used in a memory system according to an exemplary embodiment of the disclosure.
Figure 10B:
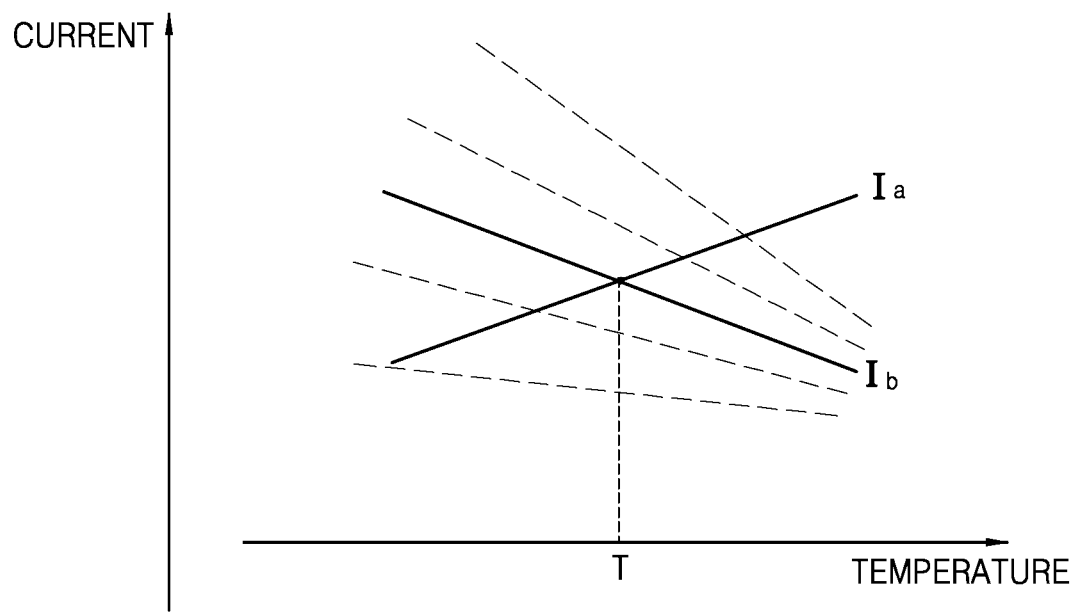

FIGS. 10A and 10B are diagrams illustrating a temperature sensor 530 used in a memory system according to an exemplary embodiment of the inventive concept.

Referring to FIG. 10A, the temperature sensor 530 may be a temperature sensor that is included in the memory chip 520 of FIG. 5A. The temperature sensor 530 may include a proportional to absolute temperature (PTAT) current generator 210, a complementary to absolute temperature (CTAT) current generator 220, and a comparator 230.

The PTAT current generator 210 includes a first and a second p-channel metal-oxide semiconductor (PMOS) transistors MP1 and MP2, a first and a second n-channel metal-oxide semiconductor (NMOS) transistors MN1 and MN2, a resistor R, and a first and a second diodes D1 and D2. The first and the second PMOS transistors MP1 and MP2 have substantially the same sizes as each other and constitute a first current mirror. The first and the second NMOS transistors MN1 and MN2 have substantially the same sizes as each other and constitute a second current mirror. Sizes of the first and the second diodes D1 and D2 have a ratio of 1:M.

Since the first current mirror including the first and the second PMOS transistors MP1 and MP2 is symmetrically connected to the second current mirror including the first and the second NMOS transistors MN1 and MN2, current $Ia_1$ is equal to current $Ia_2$. In other words, $Ia_1:Ia_2=1:1$. Since the current $Ia_1$ is equal to the current $Ia_2$, the node voltage VA and the node voltage VB are nearly equal to each other.

In general, a thermal voltage VT increases as the temperature increases. However, since current Is (diode reverse saturation current) more greatly increases, the second diode voltage VD2 decreases as the temperature increases. As a result, the current $Ia_2$ increases as the temperature increases. In other words, the PTAT current generator 210 generates the current $Ia_2$ that is proportional to the temperature. The PTAT current generator 210 generates a first voltage V1 corresponding to the current temperature according to the current $Ia_2$.

The CTAT current generator 220 includes a third PMOS transistor MP3, a third NMOS transistor MN3, a plurality of resistors Raa, and R1 through Rm, and a plurality of switching transistors T1 through Tm. Since the third NMOS transistor MN3 and the first and second NMOS transistors MN1 and MN2 constitute a current mirror, current Ib is nearly equal to the current $Ia_1$ and the current $Ia_2$. The switching transistors T1 through Tm are selectively turned on or off in response to trip temperature control signals A1 through Am. The resistors R1 through Rm that are connected to the switching transistors T1 through Tm are selectively short-circuited according to the turning on or off of the switching transistors T1 through Tm.

If the current $Ia_1$, the current $Ia_2$, and the current Ib are set to be nearly equal to one another, node voltages VA and VB of the PTAT current generator 210 and a node voltage VC of the CTAT current generator 220 are nearly equal to one another. Since the resistance of the resistors Raa, and R1 through Rm increases as the temperature increase, the current Ib flowing in the resistors Raa, and R1 through Rm decreases as the temperature increases. In other words, the CTAT current generator 220 generates current that is inversely proportional to the temperature. The CTAT current generator 220 generates a second voltage V2 corresponding to a current temperature.

The comparator 230 compares the first voltage V1 of the PTAT current generator 210 with the second voltage V2 of the CTAT current generator 220. The first and the second voltages V1 and V2 according to the current temperature are determined by the current $Ia_2$ (referred to as current Ia) and the current Ib. Therefore, the level of the first voltage V1 may be different from the level of the second voltage V2. The CTAT current generator 220 may control the level of the second voltage V2 by using the switching transistors T1 through Tm that are selectively turned on or off in response to the trip temperature control signals A1 through Am, such that the level of the second voltage V2 becomes equal to the level of the first voltage V1.

Referring to FIG. 10B, if the current Ia and the current Ib become equal to each other by the trip temperature control signals A1 through Am, the level of the second voltage V2 may become equal to the level of the first voltage V1. Therefore, the temperature sensor 530 may detect the current temperature. The trip temperature control signals A1 through Am may be provided as temperature information of the temperature sensor 530. The trip temperature control signals A1 through Am may be provided as serial bit information or parallel bit information to the memory controller 510 (see FIG. 5).

The temperature sensor 530 may be used as the temperature sensor 630 in the memory chip 620 of FIG. 6, the temperature sensors 731 through 734 in the memory chips 721 through 724 of FIG. 7A, the temperature sensor 735 in the SPD chip 725, the temperature sensor 835 in the SPD chip 825 of FIG. 8, or the temperature sensor 935 in the buffer chip 925 of FIG. 9. The temperature sensors 530, 630, 731 through 734, 735, 835, and 935 may detect temperatures of the memory chips 520, 620, 721 through 724, the SPD chips 725 and 825, or the buffer chip 925 and provide the detected temperatures as temperature information to the memory controllers 510, 710, 810, and 910.

Figure 11:
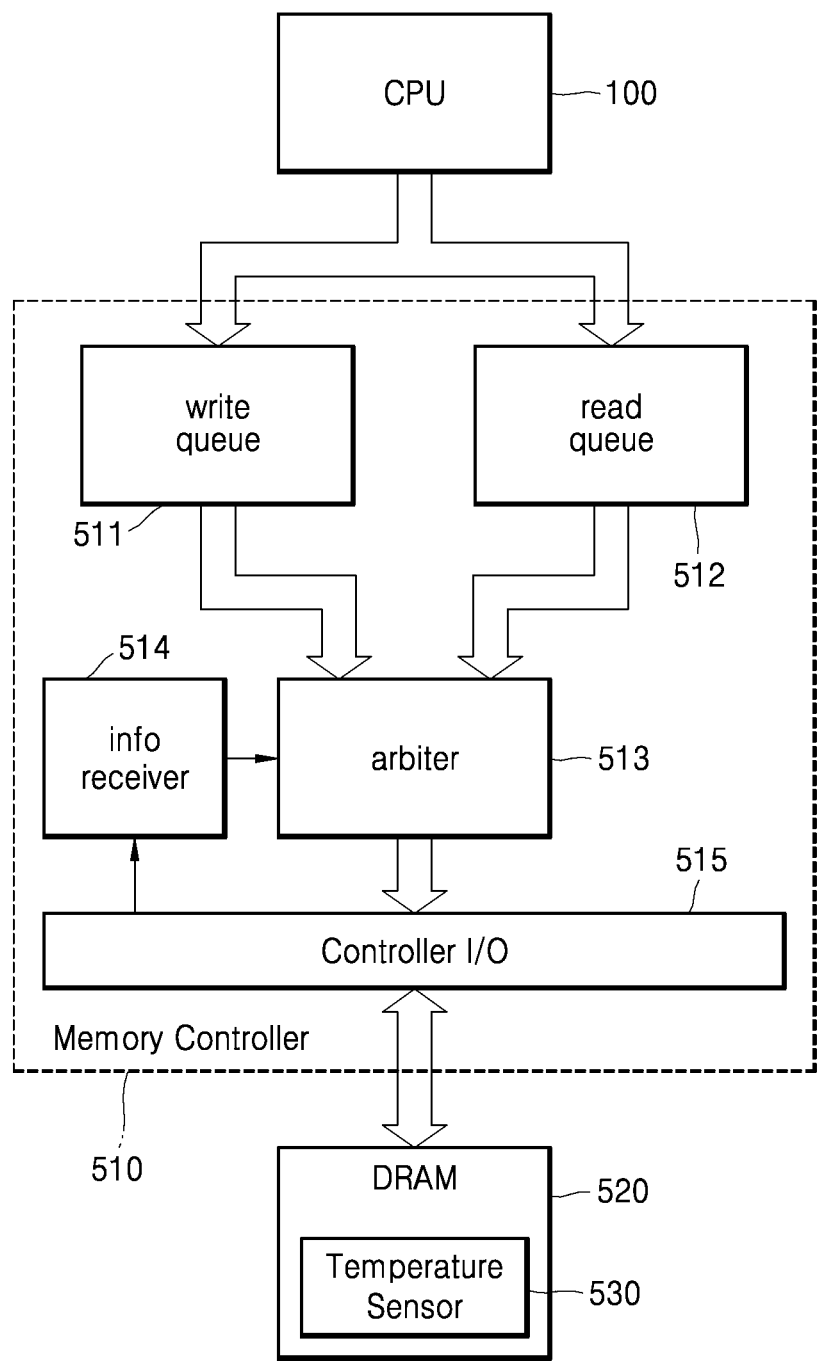
FIG. 11 is a block diagram illustrating a memory controller used in a memory system according to an exemplary embodiment of the disclosure.

FIG. 11 is a block diagram illustrating a memory controller used in a memory system according to an exemplary embodiment of the inventive concept.

Referring to FIG. 11, the memory controller is the memory controller 510 of the memory system 500 of FIG. 5. The memory controller 510 is connected to a central processing unit (CPU) 100 and the memory chip 520. The memory controller 510 includes a write queue 511, a read queue 512, an arbiter 513, an information receiver 514, and a controller input/output (I/O) unit 515. Write requests of the CPU 100 for accessing the memory chip 520 are first stored in the write queue 511, and read requests of the CPU 100 are first stored in the read queue 512.

The arbiter 513 is connected between the write queue 511 and the memory chip 520 and between the read queue 512 and the memory chip 520. The arbiter 513 performs a scheduling work for controlling requests stored in the write queue 511 and the read queue 512 to be transmitted to the memory chip 520 in order to adjust a transaction between the CPU 100 and the memory chip 520.

The information receiver 514 receives temperature information about a temperature from the temperature sensor 530 of the memory chip 520 through the controller I/O unit 515. The information receiver 514 transmits the received temperature information to the arbiter 513. The arbiter 513 determines whether the temperature of the received temperature information is higher or lower than a reference temperature TBD. If it is determined that the temperature of the received temperature information is higher than the reference temperature TBD, the arbiter 513 uses a first tWR timing requirement specification "a" of 15 ns as a tWR timing requirement specification of the memory chip 520. If it is determined that the temperature of the received temperature information is lower than the reference temperature TBD, the arbiter 513 uses a second tWR timing requirement specification "b" of 30 ns that is more relaxed than the first tWR timing requirement specification "a" as the tWR timing requirement specification of the memory chip 520.

The controller I/O unit 515 may be realized as a physical layer area. The controller I/O unit 515 defines an interface between transmission media and provides mechanical, electrical, and functional process units for transmitting a signal between data link layers. The controller I/O unit 515 transmits a command CMD, an address signal ADD, and data DATA generated in the memory controller 510 to the memory chip 520.

The memory controller 510 may be used as the memory controller 510 of FIG. 6, the memory controller 710 of FIG. 7A, the memory controller 810 of FIG. 8, or the memory controller 910 of FIG. 9. The memory controllers 510, 710, 810, and 910 may differently control timing requirement specifications of data write time (tWR) parameters of the memory chips 520, 620, 721 through 724, 821 through 824, and 921 through 924 according to temperature information about temperatures provided from the memory chips 520, 620, and 721 through 724, the SPD chips 725 and 825, and the buffer chip 925. If it is determined that the temperatures of the received temperature information are higher than the reference temperature TBD, the memory controllers 510, 710, 810, and 910 may use first tWR timing requirement specifications "a" of 15 ns as tWR timing requirement specifications of the memory chips 520, 620, 721 through 724, 821 through 824, and 921 through 924. If the temperatures of the received temperature information are lower than the reference temperature TBD, the memory controllers 510, 710, 810, and 910 may use second tWR timing requirement specifications "b" of 30 ns that are more relaxed than the first tWR timing requirement specifications "a" as the tWR timing requirement specifications of the memory chips 520, 620, 721 through 724, 821 through 824, and 921 through 924.

If the first tWR timing requirement specifications "a" of 15 ns or the second tWR timing requirement specifications "b" of 30 ns are used as the tWR timing requirement specifications of the memory chips 520, 620, 721 through 724, 821 through 824, and 921 through 924, the memory controllers 510, 710, 810, and 910 may change a setting of MRS that designates auto-precharge time periods of the memory chips 520, 620, 721 through 724, 821 through 824, and 921 through 924. If the first tWR timing requirement specifications of 15 ns are used as the tWR timing requirement specifications of the memory chips 520, 620, 721 through 724, 821 through 824, and 921 through 924, the memory controllers 510, 710, 810, and 910 may set auto-precharge characteristics of the memory chips 520, 620, 721 through 724, 821 through 824, and 921 through 924 to 15 ns. If the second tWR timing requirement specifications of 30 ns are used as the tWR timing requirement specifications of the memory chips 520, 620, 721 through 724, 821 through 824, and 921 through 924, the memory controllers 510, 710, 810, and 910 may set the auto-precharge characteristics of the memory chips 520, 620, 721 through 724, 821 through 824, and 921 through 924 to 30 ns. As soon as a write operation is completed according to the corresponding tWR timing requirement specifications, the memory chips 520, 620, 721 through 724, 821 through 824, and 921 through 924 may automatically start precharge operations. Therefore, timing confusions may be avoided between the memory controllers 510, 710, 810, and 910 and the memory chips 520, 620, 721 through 724, 821 through 824, and 921 through 924.

In various exemplary embodiments of the inventive concept, a method is described that uses different timing requirement specifications of tWR parameters of a memory chip according to temperatures. Timing requirement specifications of AC parameters other than the tWR parameters, particularly, relaxed timing requirement specifications, may be differently used according to temperatures.

While the inventive concept has been particularly shown and described with reference to exemplary embodiments thereof, they are provided for the purposes of illustration and it will be understood by those of ordinary skill in the art that various modifications and other equivalent embodiments can be made from the inventive concept. Accordingly, the true technical scope of the inventive concept is defined by the technical spirit of the appended claims.

What is claimed is:

1. A method of operating a plurality of memory devices, each including a plurality of memory cells, the method comprising:
    determining, from among the plurality of memory devices, which memory device has the lowest temperature;
    determining whether the temperature of the memory device with the lowest temperature is higher or lower than a reference temperature;
    setting a first timing parameter when the temperature of the memory device with the lowest temperature is higher than the reference temperature;
    applying the first timing parameter when writing data to a set of memory cells of a first memory device of the plurality of memory devices;
    switching the first timing parameter to a second timing parameter that includes time periods longer than those of the first timing parameter when a temperature of the first memory device is lower than the reference temperature; and
    applying the second timing parameter when writing data to the set of memory cells.

2. The method of claim 1, wherein the first timing parameter is a first timing requirement specification and the second timing parameter is a second timing requirement specification.

3. The method of claim 2, wherein the first timing requirement specification is defined in a standard for the first memory device.

4. The method of claim 1, further comprising:
    providing temperature information of the first memory device to a memory controller,
    wherein the memory controller controls the switching of the timing parameter of the first memory device based on the temperature information.

5. The method of claim 4, further comprising:
    using the memory controller to set a mode register of each memory device of the plurality of memory devices according to the timing parameter.

6. The method of claim 5, wherein an auto pre-charging time period of each memory device of the plurality of memory devices is changed by the setting of the mode register.

7. The method of claim 1, wherein the first and the second timing parameters are write recovery timing parameters.

8. A memory module comprising:
    a plurality of memory devices, each memory device including:
        a plurality of memory cells;
        a plurality of word lines electrically coupled to the memory cells;
        a plurality of bit lines electrically coupled to the memory cells; and
        a temperature sensor configured to detect the temperature of the memory device,
    wherein a memory controller for the memory module is configured to determine, based on information from the temperature sensors of the plurality of memory devices, which memory device of the plurality of memory devices has the lowest temperature, and
    wherein the memory controller is configured to use a first timing requirement specification when the detected temperature for the memory device determined to have the lowest temperature is a first temperature higher than a predetermined temperature, and a second timing requirement specification when the detected temperature for the memory device determined to have the lowest temperature is a second temperature lower than the predetermined temperature.

9. The memory device of claim 8, further comprising, for each memory device of the plurality of memory devices:
    a mode register configured to set an auto pre-charge time period of the memory device,
    wherein the memory device starts to pre-charge after a time elapse of the auto pre-charge time period after a write operation is completed, and the write operation is completed when a bit line data is sent to designated memory cells.

10. The memory device of claim 8, wherein the first and the second timing requirement specifications are write recovery timing requirement specifications.

11. A memory system comprising:
    a plurality of memory devices, each including memory cells;
    a memory controller configured to receive temperature information from outside of the memory controller, and configured to apply a first timing parameter to control the plurality of memory devices when the temperature information indicates that a temperature of a memory device having a lowest temperature from among the plurality of memory devices is higher than a predetermined temperature, and to apply a second timing parameter that includes time periods longer than those of the first timing parameter to control the plurality of memory devices when the temperature information indicates that a temperature of a memory device having a lowest temperature from among the plurality of memory devices is lower than the predetermined temperature.

12. The memory system of claim 11, wherein the first timing parameter is a first timing requirement specification and the second timing parameter is a second timing requirement specification.

13. The memory system of claim 12, wherein the first timing requirement specification is defined in a standard for the plurality of memory devices.

14. The memory system of claim 11, further comprising, for each memory device of the plurality of memory devices:
   a mode register configured to store an auto pre-charge time period of the memory device.

15. The memory system of claim 11, further comprising:
   a temperature sensor formed in each memory device of the plurality of memory devices, in a serial presence detect chip, or in a buffer chip.

16. The memory system of claim 11, wherein the plurality of memory devices are included in a memory module, the memory module comprising:
   a serial presence detect chip configured to store information of the structure of the memory module and provide the information to the memory system.

17. The memory system of claim 11, further comprising:
   a signal line; and
   a memory module comprising a buffer chip and the plurality of memory devices,
   wherein the signal line is configured to transfer signals between the memory module and the memory controller, and the buffer chip is configured to buffer signals received from the memory controller.

* * * * *